United States Patent [19]

Ishii et al.

[11] Patent Number: 4,591,833
[45] Date of Patent: May 27, 1986

[54] KEYBOARD UNIT CONTROL SYSTEM USING BLOCK SCANNING TECHNIQUES

[75] Inventors: Takatoshi Ishii; Osamu Touyama, both of Tokyo, Japan

[73] Assignee: Tokyo Shibaura Denki Kabushiki Kaisha, Kawasaki, Japan

[21] Appl. No.: 405,035

[22] Filed: Aug. 4, 1982

[30] Foreign Application Priority Data

Aug. 13, 1981 [JP] Japan .................................. 56-125909

[51] Int. Cl.$^4$ .............................................. G06F 3/02
[52] U.S. Cl. ................... 340/365 S; 340/365 R; 400/479
[58] Field of Search ................... 178/17 C; 179/90 K; 400/479.1, 479, 479.2; 340/365 R, 365 S

[56] References Cited

U.S. PATENT DOCUMENTS

| | | | |
|---|---|---|---|
| 4,020,467 | 4/1977 | Hashimoto | 340/365 S |
| 4,138,916 | 2/1979 | Kitagawa | 340/365 S |
| 4,138,917 | 2/1979 | Sakashita | 340/365 S |
| 4,148,017 | 4/1979 | Tomisawa | 340/365 S |
| 4,170,768 | 10/1979 | Kitagawa | 340/365 S |
| 4,263,582 | 4/1981 | Dumbovic | 340/365 S |
| 4,277,780 | 7/1981 | Sonderman | 340/365 S |
| 4,335,374 | 6/1982 | Nyuji | 340/365 S |

FOREIGN PATENT DOCUMENTS

| | | |
|---|---|---|
| 2852558 | 6/1979 | Fed. Rep. of Germany . |
| 90329 | 7/1981 | Japan .................................. 340/365 S |
| 90331 | 7/1981 | Japan .................................. 340/365 S |
| 2037046 | 7/1980 | United Kingdom . |
| 2047448 | 11/1980 | United Kingdom . |

OTHER PUBLICATIONS

Roger Munt, Microprocessors, vol. 2, No. 2, "Microprocessor Keyboard Encoding", Apr. 1978, pp. 67-70.
A. B. Wilkinson, Electronic Engineering, vol. 53, No. 654, "Utilising a Calculator as a Microprocessor Display/Keyboard", Jul. 1981, pp. 25-26.

Primary Examiner—John W. Caldwell, Sr.
Assistant Examiner—Michael F. Heim

[57] ABSTRACT

A keyboard unit control system having a port which includes a block selection register for specifying one of a plurality of blocks of scanning lines and a scanning data selection register for specifying one of the scanning lines of the corresponding block. The scanning data and block data are supplied to a keyboard unit through the scan line selecting logic. When the operator depresses a key on the keyboard unit, the key is detected by an interrupt detector and a detection signal is supplied to a CPU. The CPU first scans the blocks and then scans the scanning lines in the corresponding block.

4 Claims, 6 Drawing Figures

KEYBOARD UNIT CONTROL SYSTEM USING BLOCK SCANNING TECHNIQUES

BACKGROUND OF THE INVENTION

The present invention relates to a keyboard unit control system and, more particularly, to an improvement in a scanning mechanism of a keyboard with a scanning matrix by means of software.

There are generally two scanning systems of the keyboard with a matrix: a software supervising/scanning system and a hardware scanning system. In the software supervising/scanning system, the amount of hardware required is relatively small. However, the scanning operation must be always supervised, resulting in a heavy load on the software. If parallel operations such as arithmetic operations are required, they may not be satisfactorily performed. Meanwhile, in the hardware scanning system, simple software can be used, but the system itself becomes large in size, resulting in high cost. Further, the software and hardware scanning systems described above are of a dynamic scanning type, so that noise may be generated. A radio wave shield must be arranged to shield noise, resulting in a higher cost. Further, if a number of keys are arranged in the keyboard unit, the mechanism becomes bulky and an LSI device suitable to control such a keyboard unit has not been developed.

SUMMARY OF THE INVENTION

It is, therefore, an object of the present invention to eliminate the conventional drawbacks and to provide a keyboard unit control system wherein scanning matrix lines are grouped to increase the number of scanning lines with a small amount of hardware and wherein a heavy load on software is decreased by static scanning utilizing interrupt detection.

In order to achieve the above and other objects, there is provided according to the present invention a system which connects a keyboard unit to a central processing unit through a system bus, comprising:
 latch means for latching scanning data supplied from said central processing unit, the scanning data including block selection data to select one of scanning blocks each comprised of scanning lines and scanning line selection data to select one of the scanning lines in said one of scanning blocks;
 scan line selecting logic means, connected to said latch means and said keyboard unit, for selectively supplying the scanning data to said keyboard unit on the basis of the scanning data supplied from said latch means; and
 interrupt detecting means, connected to said keyboard unit and said central processing unit, for interrupting an operation of said central processing unit on the basis of data returned from said keyboard unit when the operator depresses a key.

According to the keyboard unit control system of the present invention, a small amount of hardware and a small number of bits provide a great number of scanning lines. Other effects are summarized below:
 (i) Since the block comprised of scanning lines is scanned, high speed scanning is performed;
 (ii) When an interrupt operation is performed, the load on the software becomes normally substantially zero (dynamic scanning is not performed); and
 (iii) Since static scanning is normally performed, little, if any noise is produced.

BRIEF DESCRIPTION OF THE DRAWINGS

Other objects and features of the present invention will be apparent from the following description taken in connection with the accompanying drawings in which.

DETAILED DESCRIPTION OF THE PREFERRED EMBODIMENT

Figure 1:
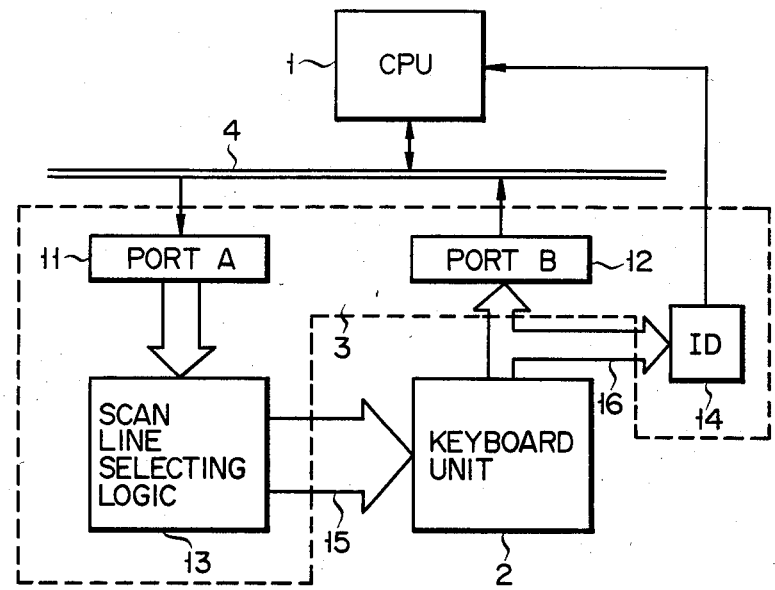
FIG. 1 is a block diagram of a keyboard unit control device according to one embodiment of the present invention.

FIG. 1 is a block diagram of a keyboard unit control device according to one embodiment of the present invention. A central processing unit 1 (to be referred to as a CPU for brevity hereinafter) which comprises a microprocessor is connected to a scan line selecting logic 13 through a system bus 4 and a port A which is represented by reference numeral 11. The Z80A microprocessor (Zilog Corporation, U.S.A.) may be used as the CPU 1. The scan line selecting logic 13 is connected to a keyboard unit 2 through scanning lines 15. The scanning lines 15 consist of 12 scanning lines (4 lines $\times$ 3 blocks). The keyboard unit 2 is connected to an interrupt detector 14 through a return line 16 and to the CPU 1 through the system bus 4 and a port B which is represented by reference numeral 12. Interface module Z80APIO (Zilog Corporation, U.S.A.) is suitable for the ports A and B and the interrupt detector 14.

Figure 2A:
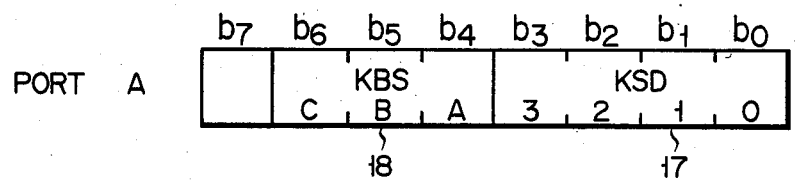
FIGS. 2A and 2B are views showing bit assignments of ports A and B of the device shown in FIG. 1.
Figure 2B:
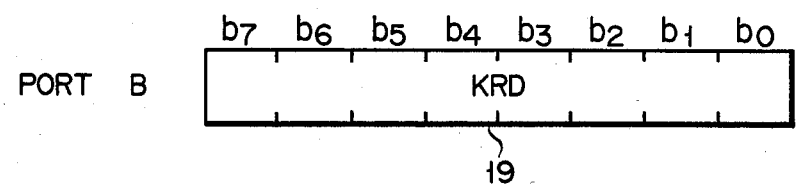

FIGS. 2A and 2B show the respective bit assignments of the ports A and B shown in FIG. 1. Referring to FIG. 2A, a scanning data selection register 17 is assigned from the 0th bit (b0) to the 3rd bit (b3) of the port A, and a block selection register 18 is assigned from the 4th bit to the 6th bit thereof. Four of the scanning lines 15 are specified in the scanning data selection register 17, while 3 blocks are specified in the block selection register 18.

Referring to FIG. 2B, return data (KRD) indicating correspondence between keyboard scanning and depression of a key are stored from the 0th bit to the 7th bit of the port B. If the operator does not depress a key, each return data bit (0th bit to 7th bit) is all logic "1". However, when the operator presses a key corresponding to a scanning line, the corresponding return line is set to logic "0". Therefore, a bit corresponding to the return line is set to logic "0".

Figure 3:
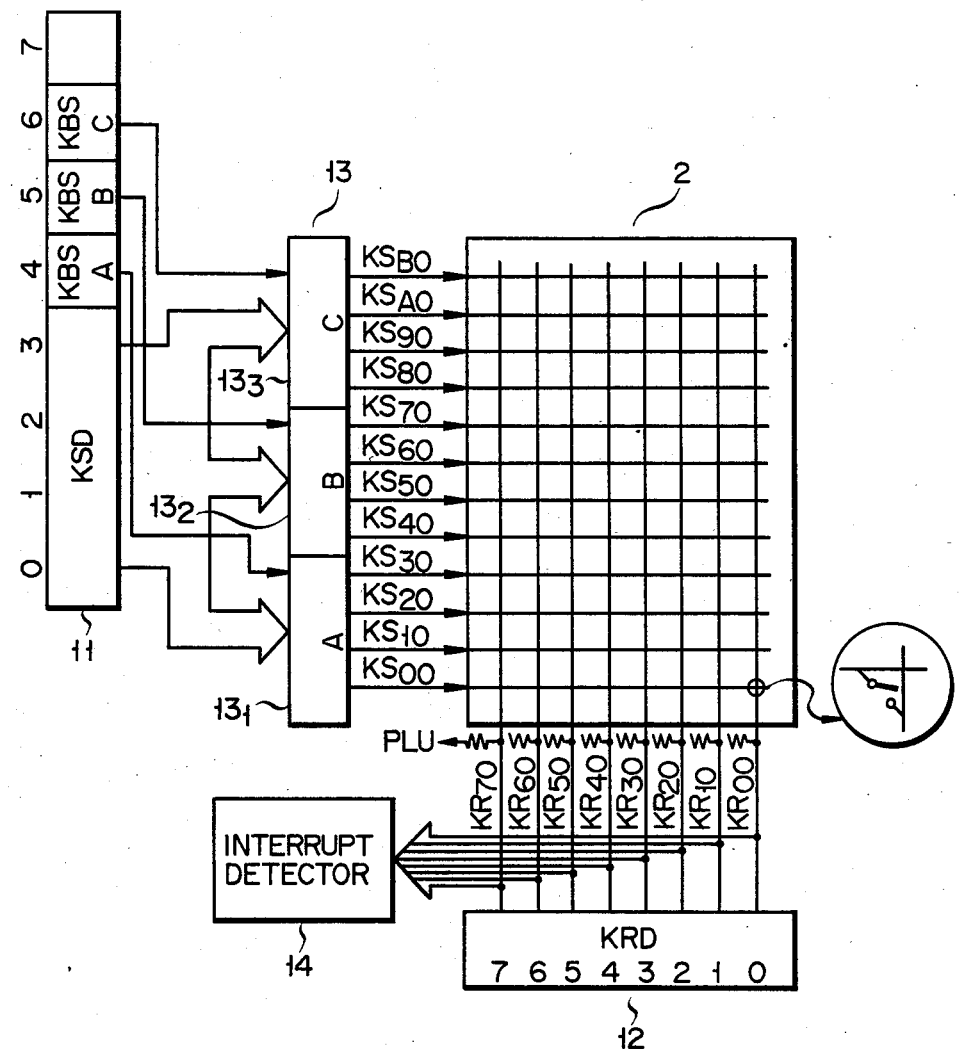
FIG. 3 is a detailed block diagram of the periphery of a keyboard unit shown in FIG. 1.

FIG. 3 is a detailed block diagram of the periphery of the keyboard unit. The same reference numerals used in FIG. 1 denote the same or similar parts, and a detailed description thereof will be omitted. Four-bit data from the scanning data selection register 17 and three-bit data from the block selection register 18 are stored in blocks A, B and C of the scan line selecting logic 13. These blocks A, B and C are respectively represented by reference numerals 13$_1$, 13$_2$ and 13$_3$. The keyboard unit 2 is constituted by a diode matrix (12 rows $\times$ 8 columns). Therefore, scanning data KS00 through KSB0 which number 12 are supplied to the 12 rows of the keyboard unit 2, respectively. Meanwhile, return data KR00 through KR70, which number 8, are supplied from the 8 columns of the keyboard unit 2 to the port B and to the interrupt detector 14.

Figure 4:
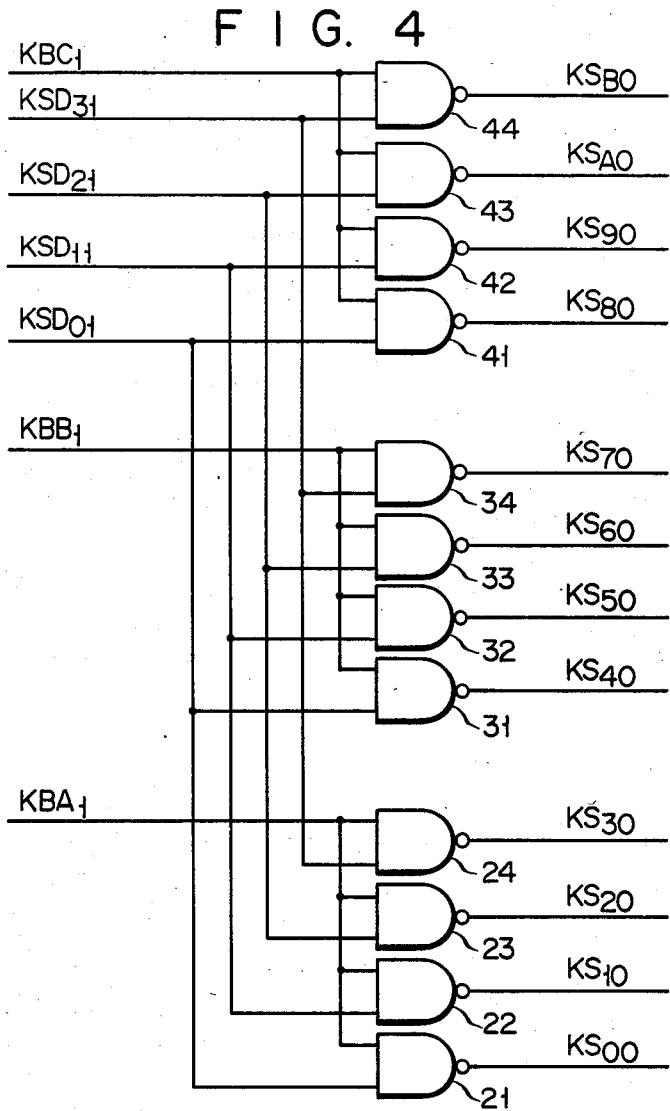
FIG. 4 is a circuit diagram showing the internal arrangement of the scan line selecting logic shown in FIGS. 1 and 3.

FIG. 4 is a circuit diagram of the scan line selecting logic 13 shown in FIG. 3. The blocks A, B and C each comprises 4 NAND gates. The 4th-bit data (KBA1) is commonly supplied from the block selection register 18 of the port A to one input terminal of each one of NAND gates 21, 22, 23 and 24 of the block A, while 0th-, 1st-, 2nd- and 3rd-bit data (KSD01, KSD11, KSD21 and KSD31) are respectively supplied from the scanning data selection register 17 of the port A to the other input terminals thereof. The 5th-bit data (KBB1) is commonly supplied from the block selection register 18 of the port A to one input terminal of each one of NAND gates 31, 32, 33 and 34 of the block B, while all the data (KSD01, KSD11, KSD21 and KSD31) are respectively supplied from the scanning data selection register 17 to the other input terminals of the NAND gates 31, 32, 33 and 34 thereof. Further, the 6th-bit data (KBC1) is commonly supplied from the block selection register 18 of the port A to one input terminal of each one of NAND gates 41, 42, 43 and 44 of the block C, while all the data (KSD01, KSD11, KSD21, KSD31) are respectively supplied from the scanning data selection register 17 to the other input terminals of the NAND gates 41, 42, 43 and 44 thereof. Outputs from the NAND gates 21 to 24, 31 to 34 and 41 to 44 represent the scanning data KS00 to KSB0.

Figure 5:
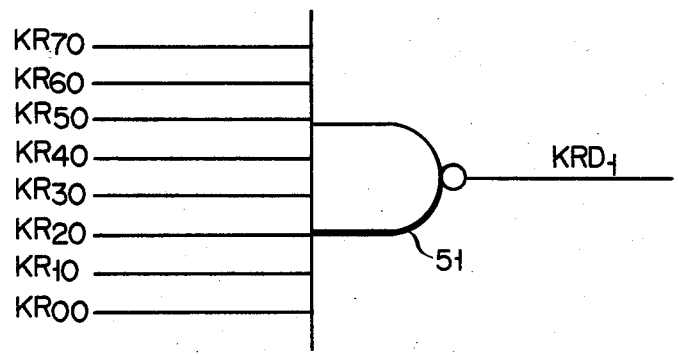
FIG. 5 is a circuit diagram of a key input detector used in a interrupt detector shown in FIG. 3.

FIG. 5 is a detailed circuit diagram of a key input detector used in the interrupt detector 14. The return data KR00 to KR70 are supplied to a NAND gate 51. If any one of the input data is logic "0," the NAND gate 51 produces an interrupt request signal KRD1.

The mode of operation of the keyboard unit control device according to one embodiment of the present invention will be described in detail. The CPU 1 sets all data for scanning every line in the port A and waits for a key input interrupt. If the key input interrupt takes place, the CPU 1 can detect a depressed key in accordance with two methods. Firstly, the CPU 1 determines a block to which the depressed key belongs and then detects the depressed key. Secondly, all of the 12 scanning lines are checked to detect a depressed key every time the operator depresses a key.

In both methods, all the data from the 4th bit through the 6th bit and the 0th bit through the 3rd bit of the port A are set at logic "1," so that the data satisfy all the conditions of the NAND gates 21 to 24, 31 to 34 and 41 to 44 as shown in FIG. 4, enabling "static" scanning. As a result of the NAND logic, all the scanning lines are set to logic "0." In this condition, if the operator depresses any one of the keys, data is obtained on the corresponding return line, which is then set to logic "0." The interrupt detector 14 interrupts the operation of the CPU 1 through a signal line on which the data KRD1 appears. The CPU 1 then determines which key is depressed in accordance with both the data in the port B and one of the methods of the following paragraphs.

According to the first method, if one of the data corresponding to the 4th through the 6th bits and all the data corresponding to the 0th through the 3rd bits of the port A are set to logic "1," the four NAND gates are rendered conductive corresponding to one of the 4th through 6th bits whose data is logic "1." Thus, four lines are simultaneously scanned.

According to the second method, if data corresponding to any one of the 4th through 6th bits and data corresponding to any one of the 0th through the 3rd bits of the port A are set to logic "1," the corresponding NAND gate is rendered conductive. Therefore, only one scanning line is scanned. Twelve scanning lines (3×4) can be scanned with 7-bit data. The CPU 1 sets data in the port A to scan all the scanning lines. If the key input waiting status is maintained, the CPU 1 need not perform any operation in a software manner and only waits for the interrupt operation. Further, since the scanning lines of the keyboard unit 2 are set to logic "0," noise may not be produced.

In the above embodiment of the present invention, only a case is described in which the keyboard matrix scanning is performed. The present invention may be applied to any general device for performing matrix detection.

Many changes and modifications in the above embodiment can, of course, be carried out without departing from the scope of the invention. That scope, therefore, is intended to be limited only by the scope of the appended claims.

What we claim is:

1. A keyboard control system for coupling a keyboard unit to a bus of a central processing unit, the central processing unit providing digital data including block selection data and line selection data, said keyboard unit having a matrix of a plurality of row lines and a plurality of column lines, said row lines and said column lines having a plurality of potential crossing positions each of said potential crossing positions corresponding unambiguously to one of a plurality of keys of said keyboard unit and each of said potential crossing positions being convertible to an electrical connection upon choosing one of said keys, said keyboard unit having means for coupling said column lines to said bus, said keyboard control system comprising:
   (a) means for latching the data from said bus, said means for latching having inputs adapted to be coupled to said bus and having outputs at which said data are provided;
   (b) means for decoding having as inputs the outputs of said means for latching and providing as outputs a plurality of scanning lines divided into blocks, each said scanning line being adapted to couple as an input to one of said row lines, said means for decoding:
      (i) in response to data corresponding to said block selection data from said latch means selecting amongst a plurality of blocks of said scanning lines, so as to simultaneously activate all of said scanning lines within a selected block to permit the central processing unit to identify in which block a chosen key is located; and
      (ii) in response to data corresponding to said line selection data selecting a single scanning line within a block, to permit the central processing unit to identify the one of said scanning lines to which said chosen key is coupled,
   whereby the central processing unit may first send block selection data to identify in which block a key is located, and then send line selection data to determine on which line within the block the key located, the final identification of the key determined by determining the column line on which a signal is returned.

2. A keyboard control system for coupling a keyboard unit to a bus of a central processing unit, said keyboard unit having a matrix of a plurality of row lines and a plurality of column lines, said row lines and said column lines having a plurality or potential crossing positions each of said potential crossing positions corresponding unambiguously to one of a plurality of keys of said keyboard unit and each of said potential crossing positions being convertible to an electrical connection upon choosing one of said keys, said keyboard control system comprising:
   (a) logic means having a plurality of inputs adapted to couple to said bus and having as outputs a plurality of scanning lines each said scanning line being adapted to couple to one of said row lines, said logic means being responsive to a predetermined input pattern to maintain all of its outputs at a first logic level;
   (b) a plurality of keyboard return lines adapted to be coupled to outputs from said column lines;
   (c) means for maintaining said keyboard return lines in a wait state at a second logic level;
   (d) means for generating an interrupt having said keyboard return lines as inputs and having an output adapted to be coupled to said bus, said means for generating responsive to said first logic level to change its logic state whereby when a key is closed, a circuit forms transmitting said first logic level from one of said scanning lines to one of said keyboard return lines, thereby changing the logic level on said output to cause a signal on the bus which can generate an interrupt at said central processing unit, in order to permit static scanning to be performed.

3. The keyboard unit control system of claim 2 wherein said central processing unit provides digital data including said predetermined input, block selection data and line selection data and wherein said logic means comprises:
   (i) means for latching said digital data in response to said interrupt, said means for latching having inputs adapted to be coupled to said bus and having outputs at which said data are provided; and
   (ii) means for decoding having as inputs the outputs of said means for latching and providing as outputs said scanning lines, said means for decoding:
   (a) in response to data corresponding to said predetermined input, setting said scanning lines to said first logic level;
   (b) in response to said block selection data, first selecting amongst a plurality of blocks of said scanning lines, so as to simultaneously scan all of said scanning lines within a selected block to identify the one of said blocks in which a chosen key is located; and
   (c) in response to said line selection data selecting sequentially amongst all of said scanning lines within said one block to identify the one of said scanning lines to which said chosen key is coupled;
   whereby said central processing unit when uninterrupted may send said predetermined input and in response to an interrupt caused by choosing a key the central processing unit may first send block selection data to identify in which block the key is located, and then send line selection data to determine on which line within the block the key located, the final identification of the key determined by determining the column line on which a signal is returned.

4. A method for controlling a keyboard unit, said keyboard unit having a plurality of scanning lines and a plurality of keyboard return lines, comprising:
   (a) maintaining said scanning lines of said keyboard unit at logic level zero;
   (b) transmitting a logic level zero from one scanning line to one keyboard return line of said keyboard unit in response to depression of a key of said keyboard unit;
   (c) generating an interrupt to a central processing unit in response to said logic level zero on said one keyboard return line;
   (d) conducting a block scan of said scanning lines, in response to said interrupt, so as to determine the location of said key including:
      (i) latching scanning data supplied from said central processing unit, said scanning data including block selection data to select one of a plurality of scanning blocks, each block including a plurality of scanning lines, and said scanning data further including scanning line selection data to select a scanning line in the selected scanning block;
      (ii) first identifying a scanning block, which contains said one scanning line, using said block selection data; and
      (iii) second identifying said one scanning line, using said scanning line selection data; and
   (e) third identifying said key using said one scanning line and said one keyboard return line.

* * * * *